(12) United States Patent
Chen et al.

(10) Patent No.: US 12,422,948 B2
(45) Date of Patent: Sep. 23, 2025

(54) TOUCH CONTROL SUBSTRATE, TOUCH DISPLAY, AND ELECTRONIC DEVICE

(71) Applicant: Huawei Technologies Co., Ltd., Shenzhen (CN)

(72) Inventors: Zesheng Chen, Dongguan (CN); Junyong Zhang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/901,901

(22) Filed: Sep. 30, 2024

(65) Prior Publication Data

US 2025/0021185 A1 Jan. 16, 2025

Related U.S. Application Data

(63) Continuation of application No. PCT/CN2023/086228, filed on Apr. 4, 2023.

(30) Foreign Application Priority Data

Apr. 7, 2022 (CN) .......................... 202210364360.4

(51) Int. Cl.
*G06F 3/041* (2006.01)

(52) U.S. Cl.
CPC ................ *G06F 3/04164* (2019.05)

(58) Field of Classification Search
CPC .... G06F 3/0443; G06F 3/0448; G06F 3/0446; G06F 3/04164; G06F 2203/04112; G06F 2203/04111; H10K 59/40

See application file for complete search history.

(56) References Cited

U.S. PATENT DOCUMENTS

| | | | |
|---|---|---|---|
| 2016/0328046 A1* | 11/2016 | Zhang | G06F 3/0445 |
| 2021/0157451 A1 | 5/2021 | Jeong et al. | |
| 2021/0333936 A1 | 10/2021 | Wang et al. | |
| 2022/0035486 A1 | 2/2022 | Kim et al. | |
| 2024/0220057 A1* | 7/2024 | Wang | G06F 3/0412 |

FOREIGN PATENT DOCUMENTS

| | | |
|---|---|---|
| CN | 105093025 A | 11/2015 |
| CN | 109669573 A | 4/2019 |
| CN | 110764660 A | 2/2020 |

(Continued)

*Primary Examiner* — Deeprose Subedi
(74) *Attorney, Agent, or Firm* — Slater Matsil, LLP

(57) ABSTRACT

A touch control substrate or assembly, a touch display, and an electronic device are disclosed. The touch control assembly includes a substrate and a touch control layer, and the touch control layer is disposed on a surface of the substrate. The touch control layer includes a plurality of touch control units that are arranged in an array, and each touch control unit includes two first electrode parts and two second electrode parts. The two first electrode parts are electrically connected, and the two second electrode parts are also electrically connected. The first electrode part extends in a first direction, the second electrode part extends in a second direction, and the first direction intersects with the second direction. The first electrode part includes a first structure part and a second structure part that are connected, and a length a of the second structure part in the first direction. Other embodiments are disclosed.

20 Claims, 14 Drawing Sheets

(56) References Cited

FOREIGN PATENT DOCUMENTS

| | | |
|---|---|---|
| CN | 111651090 A | 9/2020 |
| CN | 113050838 A | 6/2021 |
| EP | 3657310 A1 | 5/2020 |
| WO | 2012021524 A2 | 2/2012 |
| WO | 2022017499 A1 | 1/2022 |

\* cited by examiner

TOUCH CONTROL SUBSTRATE, TOUCH DISPLAY, AND ELECTRONIC DEVICE

CROSS-REFERENCE TO RELATED APPLICATIONS

This application is a continuation of International Application No. PCT/CN2023/086228, filed on Apr. 4, 2023, which claims priority to Chinese Patent Application No. 202210364360.4, filed on Apr. 7, 2022. The disclosures of the aforementioned applications are hereby incorporated by reference in their entireties.

TECHNICAL FIELD

This application relates to the field of electronic device technologies, and in particular, to a touch control substrate, a touch display, and an electronic device.

BACKGROUND

A touch control function is an important function of current human-machine interaction, and the touch control function is generally implemented by using a touch control substrate. With development of touch technologies and people's requirements for higher product effect, the touch control substrate develops toward lightness, thinness, and high integration. Currently, small-sized and medium-sized display products such as mobile phones and tablets have increasingly high requirements on lightness, thinness, and interaction experience. People are not only satisfied with interaction with a display device by using a finger, but more people start to use styluses to perform human-machine interaction. In addition to conventional operations, the stylus may further perform some professional operations such as drawing. Therefore, there is a high requirement for both uniformity and a deviation degree of a line drawn by an active stylus on a touch display.

SUMMARY

This application provides a touch control substrate or assembly, a touch display, and an electronic device, to reduce coordinate deviation values of the touch control substrate at different positions, and improve linearity of a stylus, so as to improve user experience.

According to a first aspect, this application provides a touch control substrate (or assembly). The touch control substrate includes a substrate and a touch control layer, and the touch control layer is disposed on a surface of the substrate, to implement a touch control function of the touch control substrate. The touch control layer specifically includes a plurality of touch control units that are arranged in an array, and each touch control unit includes two first electrode parts and two second electrode parts. The two first electrode parts are electrically connected, and the two second electrode parts are also electrically connected. The first electrode part extends in a first direction, the second electrode part extends in a second direction, and the first direction intersects with the second direction. In other words, the first electrode part and the second electrode part are not disposed in parallel. If the plurality touch control units are repeatedly arranged, adjacent first electrode parts in different touch control units are electrically connected to form a first electrode, and adjacent second electrode parts in different touch control units are electrically connected to form a second electrode. The first electrode intersects with the second electrode, to form a touch control pattern of the touch control substrate to implement the touch control function of the touch control substrate. The first electrode part includes a first structure part and a second structure part that are connected to each other. A length a of the second structure part in the first direction, a maximum length Lmax of the first structure part in a third direction, and a minimum length Lmin of the first structure part in the third direction meet: a≤Lmax≤5Lmin. The second structure part of a smaller size is better, and is more conducive to making the first structure part larger in size as a main part of the first electrode. The maximum length Lmax of the first structure part in the third direction is not greater than five times the minimum length Lmin of the first structure part in the third direction. The third direction is perpendicular to the first direction, a size change of the first structure part in a direction perpendicular to an extension direction of the first structure part is small, and the first structure part is a main channel of a signal of the first electrode. In this solution, signal uniformity of the first electrode part in the extension direction of the first electrode part is good. Further, signal uniformity of the first electrode in an extension direction of the first electrode is also good. Therefore, in this solution, coordinate deviation values of the touch control substrate at different positions may be small, and linearity of a stylus may be improved. This improves user experience, and improves professional performance of an electronic device having a touch display.

In a further technical solution, the maximum length Lmax of the first structure part in the third direction and the minimum length Lmin of the first structure part in the third direction meet: Lmax≤3Lmin. A smaller size change of the first structure part in the extension direction of the first structure part is more conducive to improving the signal uniformity of the first electrode in the extension direction of the first electrode.

When the first electrode part is specifically disposed, the first electrode part may further include at least one first branch part, and the first branch part is electrically connected to the first structure part. In this solution, in addition to extending in the first direction X, the first electrode part may further extend to another area, so that the first electrode part extends to a large amount of space, to supplement a spatial signal uniformity of the first electrode part.

When the first branch part is specifically disposed, the first branch part may be located in an edge area of the touch control unit, to reserve space for another structure.

The first electrode part may further include at least one second branch part, and the second branch part is electrically connected to the first branch part. In this solution, space for extension of the first electrode part may be further increased, to further supplement the spatial signal uniformity of the first electrode part, so that uniformity of a signal of the first electrode part in the entire touch control unit is good.

Specifically, when the touch control substrate is manufactured, the first structure part, the second structure part, the first branch part, and the second branch part may be of an integrated structure, to simplify a manufacturing process of the first electrode part. In addition, strength of connections between the first branch part, the second branch part, the first structure part, and the second structure part can be improved.

When the second branch part is specifically disposed, the second branch part may also be located in the edge area of the touch control unit, to reserve space for another structure.

The first electrode part may be specifically of a symmetric structure, and a symmetry axis of the first electrode part extends in the first direction. This solution helps improve signal uniformity of the touch control substrate, and helps manufacture the touch control layer.

A manner in which the two first electrode parts in the touch control unit are electrically connected is not limited. In a specific technical solution, the two first electrode parts are connected through a bridge, to avoid a short-circuit connection to the second electrode part.

To implement an electrical connection between the two first electrode parts in the touch control unit, the touch control unit may further include an additional part, and the two first electrode parts are electrically connected to the additional part through bridges, to implement the electrical connection between the two first electrode parts. This solution helps shorten a length of the bridge, to improve the reliability of the bridge and make the bridge not easy to be damaged.

A specific shape of the first electrode part is not limited. For example, an edge that is of the first structure part and that extends in the first direction may be a straight line, a serrated line, a wavy line, a line having a groove, or the like. The shape of the first electrode part is designed according to an actual product requirement.

Similarly, the second electrode part includes a third structure part and a fourth structure part that are connected to each other, and a length a' of the fourth structure part in the second direction, a maximum length Lmax' of the third structure part in a fourth direction, and a minimum length Lmin' of the third structure part in the fourth direction meet: a'≤Lmax'≤5Lmin'. The fourth structure part of a smaller size is better, and is more conducive to making the third structure part larger in size as a main part of the first electrode. The maximum length Lmax' of the third structure part in the fourth direction is not greater than five times the minimum length Lmin' of the third structure part in the fourth direction. A size change of the third structure part in a direction perpendicular to an extension direction of the third structure part is small, and the third structure part is a main channel of a signal of the second electrode. Therefore, in this solution, signal uniformity of the second electrode part in an extension direction of the second electrode part is good. Further, signal uniformity of the second electrode in an extension direction of the second electrode is also good. Therefore, in this solution, coordinate deviation values of the touch control substrate at different positions may be small, and linearity of a stylus may be improved. This improves user experience, and improves professional performance of an electronic device having a touch display.

In a further technical solution, the maximum length Lmax' of the third structure part in the fourth direction and the minimum length Lmin' of the third structure part in the fourth direction meet: Lmax'≤3Lmin'. A smaller size change of the third structure part in the direction perpendicular to the extension direction of the third structure part is more conducive to improving the signal uniformity of the second electrode in the extension direction of the second electrode.

When the second electrode part is specifically disposed, the second electrode part may further include at least one third branch part, and the third branch part is electrically connected to the third structure part. In this solution, in addition to extending in the second direction, the second electrode part may further extend to another area, so that the second electrode part extends to a large amount of space, to supplement a spatial signal uniformity of the second electrode part.

The second electrode part may further include at least one fourth branch part, and the fourth branch part is electrically connected to the third branch part. In this solution, space for extension of the second electrode part may be further increased, to further supplement the spatial signal uniformity of the second electrode part, so that uniformity of a signal of the second electrode part in the entire touch control unit is good.

Specifically, when the touch control substrate is manufactured, the third structure part, the fourth structure part, the third branch part, and the fourth branch part may be of an integrated structure, to simplify a manufacturing process of the second electrode part. In addition, strength of connections between the third branch part, the fourth branch part, the third structure part, and the fourth structure part can be improved.

The second electrode part may be specifically of a symmetric structure, and a symmetry axis of the second electrode part extends in the second direction. This solution helps improve signal uniformity of the touch control substrate, and helps manufacture the touch control layer.

A manner in which the two second electrode parts in the touch control unit are electrically connected is not limited. In a specific technical solution, the two second electrode parts are of an integrated structure, to help simplify a manufacturing process of the touch control layer.

A specific shape of the second electrode part is not limited. For example, an edge that is of the third structure part and that extends in the first direction may be a straight line, a serrated line, a wavy line, a line having a groove, or the like. The shape of the second electrode part is designed according to an actual product requirement.

According to a second aspect, this application provides a touch display. The touch display includes a light emitting layer, an encapsulation layer, and the touch control substrate according to the first aspect. The light emitting layer, the encapsulation layer, and the touch control substrate are sequentially disposed. The touch display has a display function, and has a touch control function. In addition, the touch display has high touch control precision, and a small coordinate deviation value. Therefore, user experience is good.

According to a third aspect, this application further provides an electronic device. The electronic device includes a circuit board and the touch display according to the second aspect. The circuit board is electrically connected to the touch display, and the circuit board interacts with the touch display to implement a function of the touch display. The electronic device has a touch control function with high precision, and a small coordinate deviation value. Therefore, user experience is good.

REFERENCE NUMERALS

Figure 1:
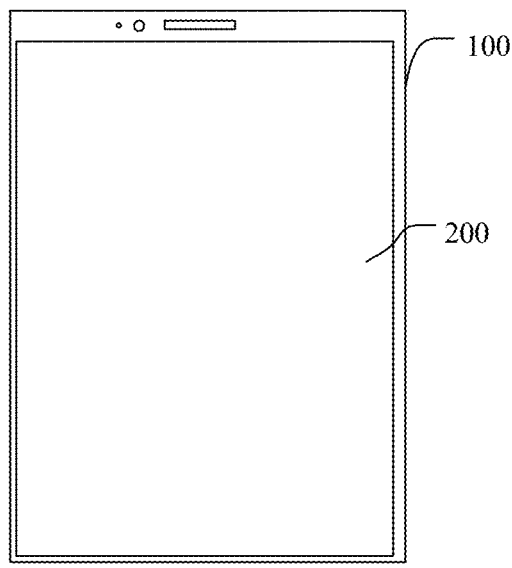
FIG. 1 is a diagram of a structure of an electronic device according to an embodiment of this application.

100: circuit board; 200: touch display;
210: light emitting layer; 220: encapsulation layer;
230: barrier layer; 240: touch control substrate;
1: touch control layer; 11: first electrode;
12: second electrode; 13: touch control unit;
131: first electrode part; 1311: first structure part;
1312: second structure part; 1313: first branch part;
1314: second branch part; 132: second electrode part;
1321: third structure part; 1322: fourth structure part;
1323: third branch part; 1324: fourth branch part;
133: floating ground block; 134: additional part;
131': first electrode part; 132': second electrode part;

X: first direction; Y: second direction;
M: third direction; and N: fourth direction.

DETAILED DESCRIPTION OF ILLUSTRATIVE EMBODIMENTS

Terms used in the following embodiments are merely intended to describe specific embodiments, but are not intended to limit this application. The terms "one", "a", "the", "the foregoing", "this", and "the one" of singular forms used in this specification and the appended claims of this application are also intended to include expressions such as "one or more", unless otherwise specified in the context clearly.

Reference to "an embodiment" or "a specific embodiment" or the like described in the specification means that one or more embodiments of this application include a specific feature, structure, or characteristic described with reference to this embodiment. The terms "include", "contain", "have", and their variants all mean "include but are not limited to", unless otherwise specifically emphasized in another manner.

To facilitate understanding of a touch control substrate, a touch display, and an electronic device provided in embodiments of this application, the following first describes application scenarios of the touch control substrate, the touch display, and the electronic device. The electronic device is an electronic device having a touch control function. In other words, the electronic device may perform a human-computer interaction operation by using a touch display. For example, the electronic device may include but is not limited to a mobile phone, a tablet computer, a notebook computer, an e-book reader, a camera, a wearable device, a smart home device, and the like. With development of technologies, a function of the electronic device is not limited to performing a touch control operation by using a finger, but has developed to performing a touch control function operation by using a stylus. The stylus has a small nib size, which helps implement a fine touch control operation, for example, drawing a line. However, in the conventional technology, signal distribution of touch control units in a touch control substrate is uneven, resulting in poor uniformity and accuracy of writing. Therefore, this application provides a touch control substrate, a touch display, and an electronic device, to resolve the foregoing problem. To make the objectives, technical solutions, and advantages of this application clearer, the following further describes this application in detail with reference to the accompanying drawings.

FIG. 1 is a diagram of a structure of an electronic device according to an embodiment of this application. The electronic device in embodiments of this application includes a circuit board 100 and a touch display 200. The circuit board 100 is electrically connected to the touch display 200, to exchange information with the touch display 200. In addition to the circuit board 100 and the touch display 200, the electronic device may further include electronic components such as a battery, a receiver, a speaker, and a camera. The circuit board 100 may integrate electronic components such as a main controller, a storage unit, an antenna module, and a power management module of the electronic device. The battery may supply power to electronic components such as the touch display 200, the circuit board, the receiver, the speaker, and the camera. The electronic device may be specifically a medium-sized product, for example, a foldable terminal, a tablet computer, or a display.

Figure 2:
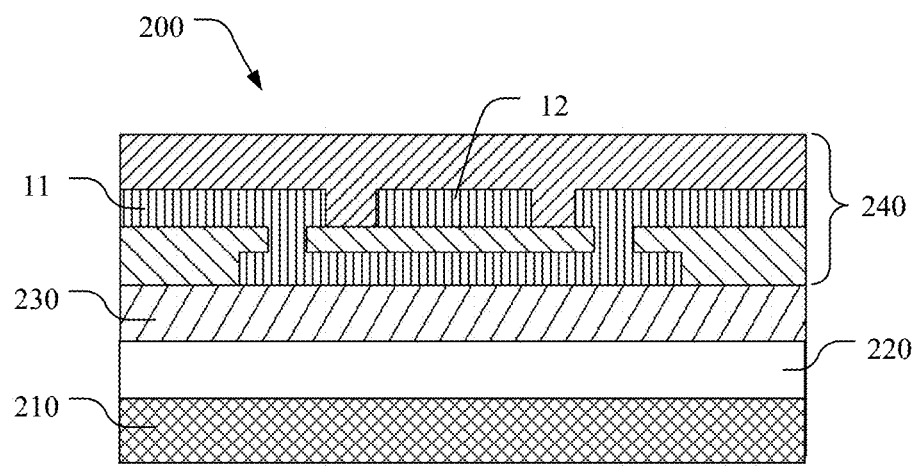
FIG. 2 is a diagram of a partial cross-sectional structure of a touch display according to an embodiment of this application.

FIG. 2 is a diagram of a local cross-sectional structure of the touch display according to an embodiment of this application. As shown in FIG. 2, the touch display 200 includes a light emitting layer 210, an encapsulation layer 220, a barrier layer 230, and a touch control substrate 240 that are sequentially stacked. The light emitting layer 210 is configured to implement a display function of the touch display 200. Certainly, when the touch display 200 is specifically prepared, the touch display 200 further includes other structures, which are not listed one by one herein. In addition, another structure may also be disposed between the light emitting layer 210 and the encapsulation layer 220 according to a requirement, and another structure may also be disposed between the encapsulation layer 220 and the touch control substrate 240 according to a requirement. This is not limited in this application.

The touch display 200 may be specifically a display panel integrating a touch control function, for example, may use solutions such as TOE (Touch on Encapsulation), On-cell, and In-cell, or external solutions such as a GFF (glass/film/film), GF2, Metalmesh, OGS (one glass solution), and an OGM (on-glass metal mesh).

Figure 3:
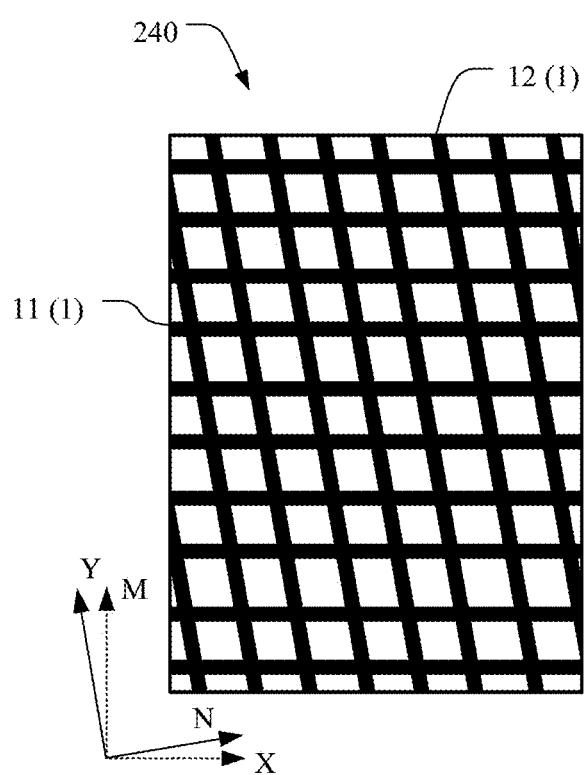
FIG. 3 is a diagram of a structure of a touch control substrate according to an embodiment of this application.

FIG. 3 is a diagram of a structure of the touch control substrate according to an embodiment of this application. As shown in FIG. 3, the touch control substrate 240 includes a substrate (not shown in the figure) and a touch control layer 1, and the touch control layer 1 is disposed on a surface of the substrate. The touch control layer 1 includes a plurality of first electrodes 11 extending in a first direction X and a plurality of second electrodes 12 extending in a second direction Y. Specifically, the first direction X intersects with the second direction Y. In other words, the first electrodes 11 and the second electrodes 12 may form a grid shape, for determining coordinates of a touch point at the touch control layer 1. The plurality of first electrodes 11 are spaced by a first preset distance in a third direction M, and the third direction M is perpendicular to the first direction X. The plurality of second electrodes 12 are spaced by a second preset distance in a fourth direction N, and the fourth direction N is perpendicular to the second direction Y. Although the first electrodes 11 and the second electrodes 12 are disposed in the grid shape, a cross area between the first electrode 11 and the second electrode 12 is insulated. Specifically, one of the first electrode 11 and the second electrode 12 may be connected through a bridge. During specific implementation, the first electrode 11 may be used as a transmitting electrode, and the second electrode 12 may be used as a receiving electrode; or the first electrode 11 may be used as a receiving electrode, and the second electrode 12 may be used as a transmitting electrode. In this case, the touch control substrate 240 may be formed as a mutual capacitive touch control substrate 240.

Figure 4:
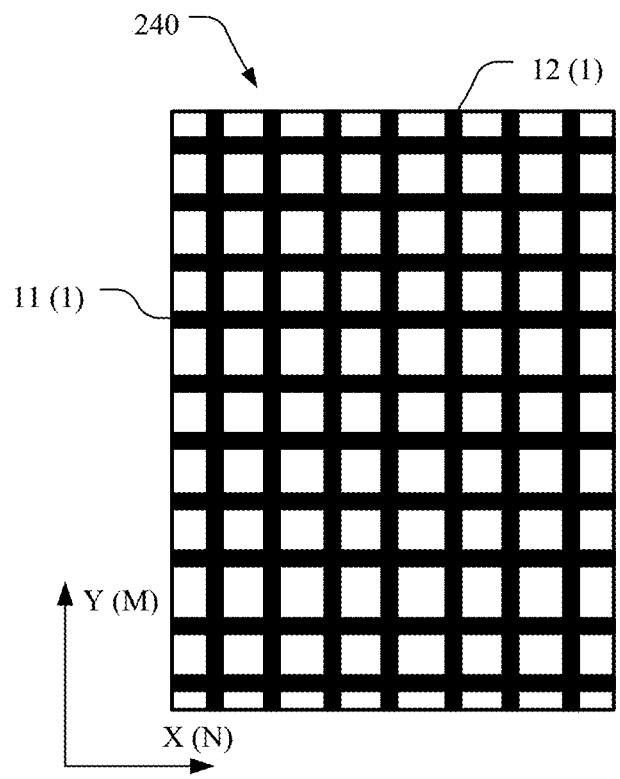
FIG. 4 is a diagram of another structure of a touch control substrate according to an embodiment of this application.

In a specific embodiment, the first direction X may be perpendicular to the second direction Y, or may not be perpendicular to the second direction Y. FIG. 4 is a diagram of another structure of the touch control substrate according to an embodiment of this application. As shown in FIG. 4, when the first direction X is perpendicular to the second direction Y, the third direction M is the same as the second direction Y, and the fourth direction N is the same as the first direction X.

In embodiments of this application, a material of each of the first electrode 11 and the second electrode 12 may be single-layer metal, for example, metal molybdenum (Mo), metal titanium (Ti), or metal aluminum (Al), or may be multi-layer metal, for example, a titanium (Ti) layer, an aluminum (Al) layer, and a titanium (Ti) layer that are sequentially stacked, or a molybdenum (Mo) layer, an aluminum (Al) layer, and a molybdenum (Mo) layer that are sequentially stacked, or may be a conductive medium, for example, indium tin oxide (ITO) or a silver (Ag) nanowire. This is not limited in this application.

Figure 5:
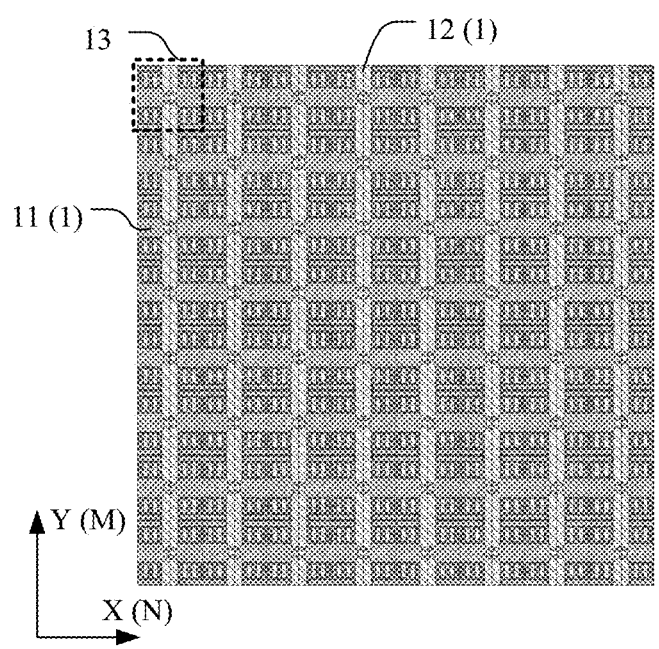
FIG. 5 is a partial enlarged diagram of a touch control layer according to an embodiment of this application.

FIG. 5 is a partial enlarged diagram of the touch control layer according to an embodiment of this application. As shown in FIG. 5, in this embodiment, for example, the first direction X is perpendicular to the first direction Y. If the cross area between the first electrode 11 and the second electrode 12 is used as a touch control unit 13, the touch control layer 1 of the touch control substrate 240 includes a plurality of touch control units 13 arranged in an array. The following describes the touch control layer 1 of the touch control substrate 240 in embodiments of this application by using one of the touch control units 13 as an example.

Figure 6:
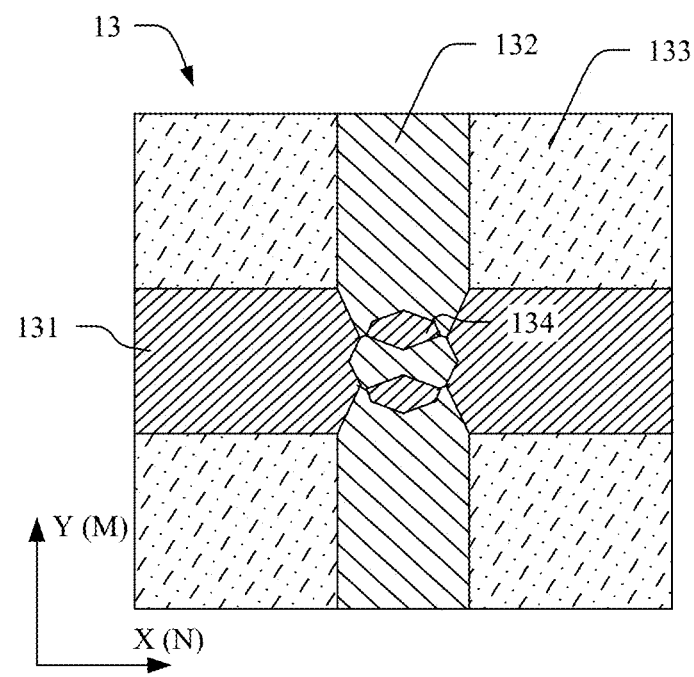
FIG. 6 is a diagram of a structure of a touch control unit according to an embodiment of this application.

FIG. 6 is a diagram of a structure of the touch control unit 13 according to an embodiment of this application. As shown in FIG. 6, the touch control unit 13 includes two first electrode parts 131 and two second electrode parts 132. The two first electrode parts 131 are electrically connected, and are used as a part of the first electrode 11. Specifically, the first electrode part 131 extends in the first direction X. Similarly, the two second electrode parts 132 are electrically connected, and are used as a part of the second electrode 12. Specifically, the second electrode part 132 extends in the second direction Y.

Figure 7:
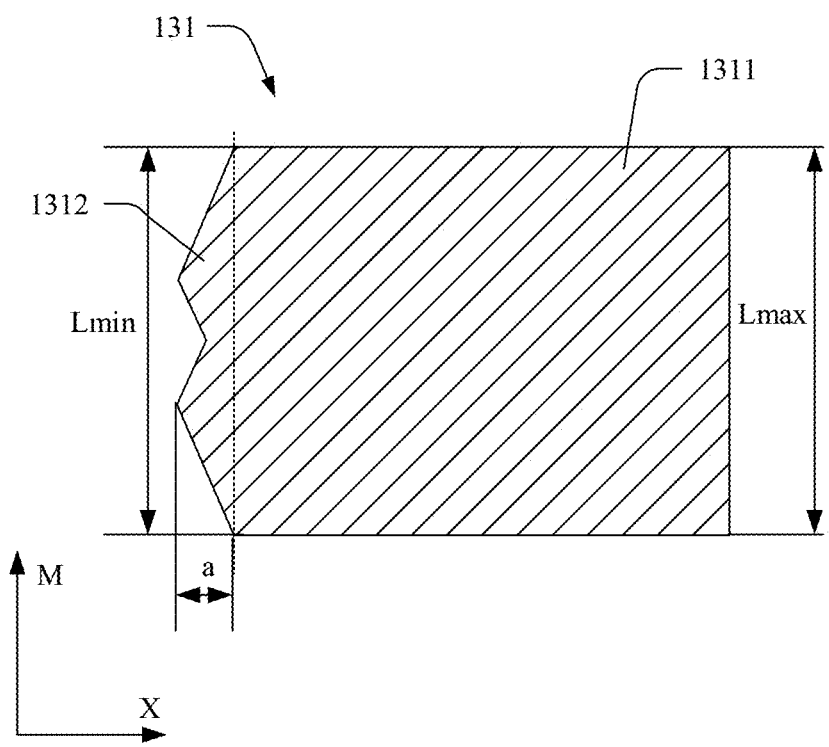
FIG. 7 is an enlarged diagram of a first electrode part in FIG. 6.

FIG. 7 is an enlarged diagram of the first electrode part 131 in FIG. 6. Refer to FIG. 6 and FIG. 7. The first electrode part 131 includes two parts: a first structure part 1311 and a second structure part 1312. The first structure part 1311 may be considered as a main body part of the first electrode part 131, occupies a larger area proportion of the first electrode part 131, and is a main part of the first electrode part 131. The second structure part 1312 is an additional part of the first electrode part 131, occupies a smaller area proportion of the first electrode part 131, and may be specifically configured to implement an electrical connection between two adjacent first electrode parts 131. From a perspective of shapes, generally, a shape of the first structure part 1311 is regular, and a shape of the second structure part 1312 may be irregular. Two adjacent first electrode parts 131 may be symmetrically disposed, or may be asymmetrically disposed. When the two adjacent first electrode parts 131 are symmetrically disposed, second structure parts 1312 of the two first electrode parts 131 of the touch control unit 13 are opposite, and the two first electrode parts 131 may be electrically connected through the second structure parts 1312. From a perspective of sizes, a length a of the second structure part 1312 in the first direction X, a maximum length Lmax of the first structure part 1311 in the third direction M, and a minimum length Lmin of the first structure part 1311 in the third direction M meet: a≤Lmax≤5Lmin. In other words, the maximum length Lmax of the first structure part 1311 in the third direction M is not greater than five times the minimum length Lmin of the first structure part 1311 in the third direction M. A size of the first structure part 1311 changes slightly in a direction perpendicular to an extension direction of the first structure part 1311. In the embodiment shown in FIG. 7, the maximum length Lmax of the first structure part 1311 in the third direction M and the minimum length Lmin of the first structure part 1311 in the third direction M meet: Lmax=Lmin. It may be considered that the size of the first structure part 1311 does not change in the direction perpendicular to the extension direction of the first structure part 1311. The first structure part 1311 is a main channel of a signal of the first electrode 11. In this solution, signal uniformity of the first electrode part 131 in the extension direction of the first electrode part 131 is good. In this solution, a size of the second structure part 1312 may be small, and a smaller size of the second structure part 1312 is more conducive to improving the signal uniformity of the first electrode part 131. Because the first electrode 11 is formed by electrically connecting a plurality of first electrode parts 131, and signal uniformity of each first electrode part 131 in an extension direction of the first electrode part 131 is good, signal uniformity of the first electrode 11 in an extension direction of the first electrode 11 is also good. Therefore, in this solution, coordinate deviation values of the touch control substrate 240 at different positions may be small, and linearity of the stylus can be improved. This further improves user experience and improves professional performance of the electronic device having the touch display 200. For example, it is more beneficial to use the electronic device as a drawing board to draw various images or graphics.

Refer to FIG. 6. In some embodiments of this application, the touch control unit 13 may further include a floating ground block 133. There is a gap between the floating ground block 133 and each of the first electrode part 131 and the second electrode part 132. In other words, the floating ground block 133 is not electrically connected to the first electrode part 131, and the floating ground block 133 is not electrically connected to the second electrode part 132. The floating ground block 133 may enable a mutual capacitance value between the first electrode part 131 and the second electrode part 132 to be within a working range, so that the touch control unit 13 has better electric field distribution, to improve performance of the touch control substrate. In a specific embodiment, an edge of the floating ground block 133 may be a straight line, a curve, a serrated line, a wavy line, or the like. This is not limited in this application.

In a specific embodiment, two adjacent first electrode parts 131 in the first direction X are electrically connected, to form the first electrode 11. Specifically, the two adjacent first electrode parts 131 may be of an integrated structure, or may be electrically connected through a structure like a bridge. This is not limited in embodiments of this application. In addition, two adjacent second electrode parts 132 in the second direction Y are electrically connected, to form the second electrode 12. Specifically, the two adjacent second electrode parts 132 may be of an integrated structure, or may be electrically connected through a structure like a bridge. This is not limited in this application.

In some other embodiments of this application, to further improve the signal uniformity of the first electrode 11 in the extension direction of the first electrode 11, the maximum length Lmax of the first structure part 1311 in the third direction M and the minimum length Lmin of the first structure part 1311 in the third direction M meet: Lmax≤3Lmin. A smaller size change of the first structure part 1311 in the extension direction of the first structure part 1311 is more conducive to improving the signal uniformity of the first electrode 11 in the extension direction of the first electrode 11. In an embodiment, the first structure part 1311 may be closer to a strip shape, or as shown in FIG. 7, the first structure part 1311 may be rectangular.

Specific shapes of the first structure part 1311 and the second structure part 1312 are not limited. Specifically, an edge that is of the first structure part 1311 and that extends in the first direction X may be a straight line, a serrated line, a wavy line, a line having a groove, or the like. The first structure part 1311 has two of the edges side by side in the third direction M. The two edges may be disposed in parallel, or may be disposed symmetrically, or may be disposed according to a requirement. The following lists several possible embodiments to describe a shape of the first electrode part 131 in embodiments of this application.

Figure 8:
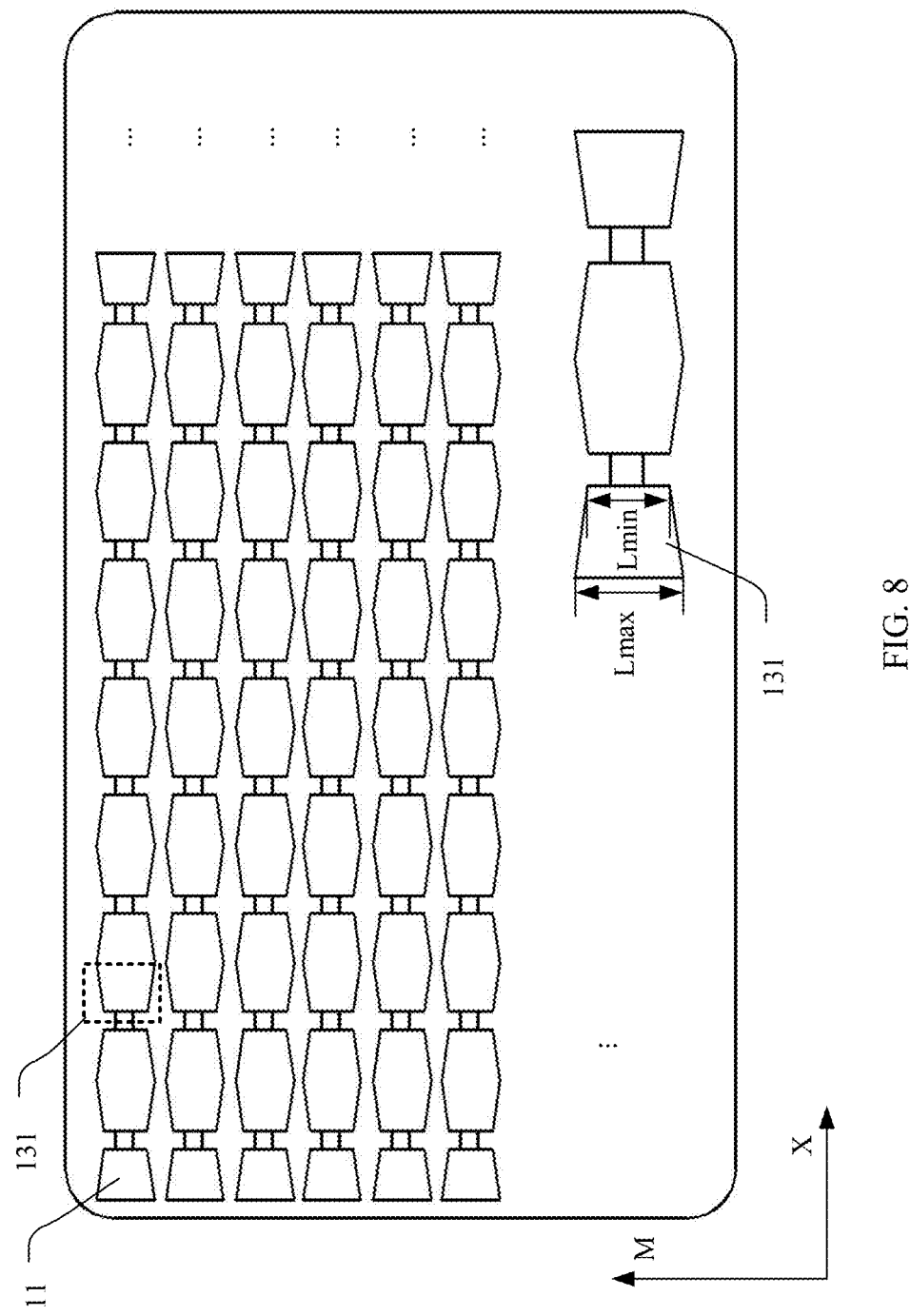
FIG. 8 is a diagram of an arrangement of first electrodes of a touch control substrate according to an embodiment of this application.

FIG. 8 is a diagram of an arrangement of the first electrodes 11 of the touch control substrate according to an embodiment of this application. As shown in FIG. 8, the first structure part 1311 of the first electrode part 131 may be of a trapezoidal structure, the edge that is of the first structure part 1311 and that extends in the first direction X is a straight line, and the two edges are symmetrically disposed. It may be considered that a short side of the trapezoid is the minimum length Lmin of the first structure part 1311 in the third direction M, and a long side of the trapezoid is the maximum length Lmax of the first structure part 1311 in the third direction M. In this embodiment, it may be considered that the length a of the second structure part 1312 in the first direction X is 0. In other words, the second structure part 1312 does not exist. Alternatively, a partial structure is obtained, as the second structure part 1312, from the trapezoidal structure through division according to a requirement. This is not limited in this application.

Figure 9:
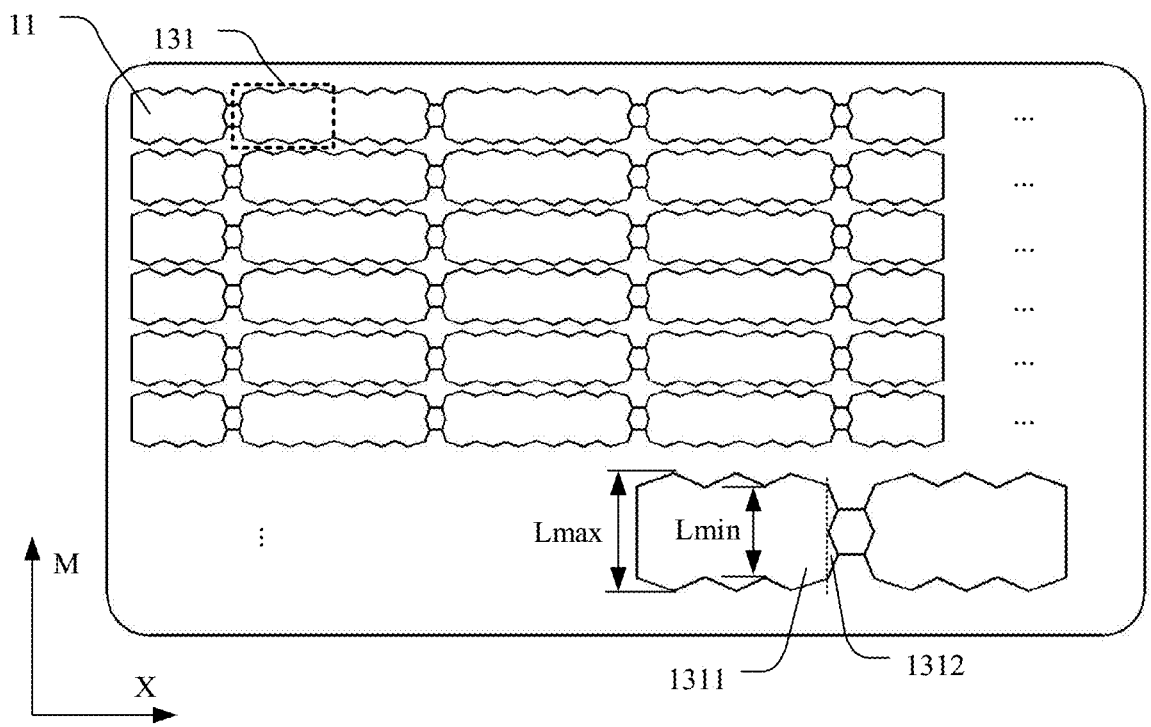
FIG. 9 is a diagram of another arrangement of first electrodes of a touch control substrate according to an embodiment of this application.

FIG. 9 is a diagram of another arrangement of the first electrodes 11 of the touch control substrate according to an embodiment of this application. As shown in FIG. 9, the edge that is of the first structure part 1311 of the first electrode part 131 and that extends in the first direction X is serrated, and the two edges are symmetrically disposed. The minimum length Lmin of the first structure part 1311 in the third direction M and the maximum length Lmax of the first structure part 1311 in the third direction M are shown in FIG. 9. In addition, as shown in FIG. 9, an area that is in one touch control unit 13 and in which two electrically connected first electrode parts 131 are close to each other has an irregular area, and a length of the first electrode part 131 in the third direction M significantly decreases, so that a connection through a bridge can be easily implemented. This area is the second structure part 1312, and the second structure part 1312 in this embodiment is of a structure with two smaller triangles.

Figure 10:
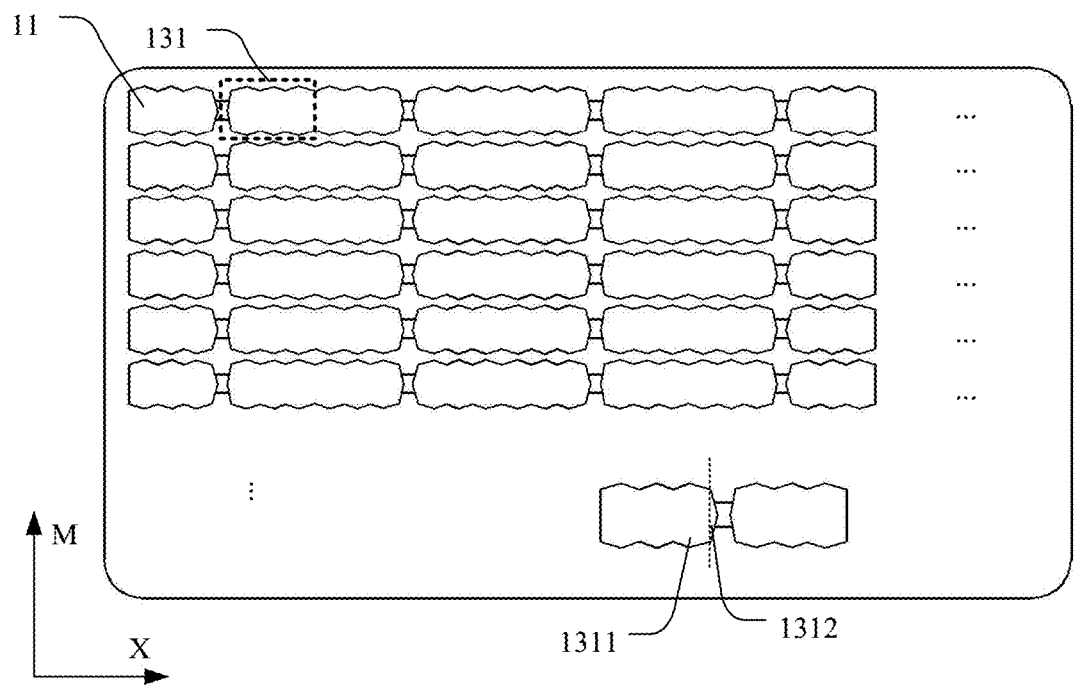
FIG. 10 is a diagram of another arrangement of first electrodes of a touch control substrate according to an embodiment of this application.

FIG. 10 is a diagram of another arrangement of the first electrodes 11 of the touch control substrate according to an embodiment of this application. As shown in FIG. 10, the first structure part 1311 of the first electrode part 131 is similar to the first structure part 1311 shown in FIG. 9. Specifically, the first structure part 1311 in this embodiment and the first structure part 1311 in the embodiment shown in FIG. 9 mainly differ in the different second structure part 1312. In this embodiment, the second structure part 1312 is of a structure with a larger triangle.

The foregoing embodiments are merely used as examples to describe possible implementations of the first electrode part 131. In actual application, the shape of the first electrode part 131 may be designed and manufactured according to an actual requirement.

In the embodiments shown in FIG. 6 to FIG. 10, the first electrode part 131 may be of a symmetric structure, and a symmetry axis of the first electrode part 131 extends in the first direction X. This solution helps improve signal uniformity of the touch control substrate 240, and helps manufacture the touch control layer 1. Certainly, in another embodiment, the first electrode part 131 may alternatively be of an asymmetric structure. This is not limited in this application.

Figure 11:
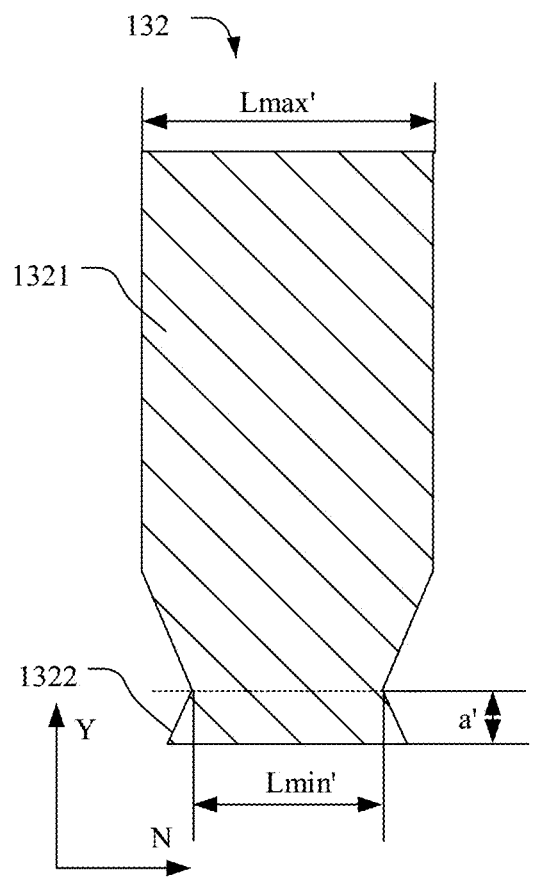
FIG. 11 is an enlarged diagram of a second electrode part in FIG. 6.

FIG. 11 is an enlarged diagram of the second electrode part 132 in FIG. 6. Refer to FIG. 6 and FIG. 11. The second electrode part 132 includes two parts: a third structure part 1321 and a fourth structure part 1322. The third structure part 1321 may be considered as a main body part of the second electrode part 132, occupies a larger area proportion of the second electrode part 132, and is a main part of the second electrode part 132. The fourth structure part 1322 is an additional part of the second electrode part 132, occupies a smaller area proportion of the second electrode part 132, and may be specifically configured to implement an electrical connection between two adjacent second electrode parts 132. From a perspective of shapes, generally, a shape of the third structure part 1321 is regular, and a shape of the fourth structure part 1322 may be irregular. Two adjacent second electrode parts 132 may be symmetrically disposed, or may be asymmetrically disposed. When the two adjacent second electrode parts 132 are symmetrically disposed, fourth structure parts 1322 of the two second electrode parts 132 of the touch control unit 13 are opposite, and the two second electrode parts 132 may be electrically connected through the fourth structure parts 1322. From a perspective of sizes, a length a' of the fourth structure part 1322 in the second direction Y, a maximum length Lmax' of the third structure part 1321 in the fourth direction N, and a minimum length Lmin' of the third structure part 1321 in the fourth direction N meet: Lmax'≤5Lmin'. In other words, the maximum length Lmax' of the third structure part 1321 in the fourth direction N is not greater than five times the minimum length Lmin' of the third structure part 1321 in the fourth direction N. A size of the third structure part 1321 changes slightly in a direction perpendicular to an extension direction of the third structure part 1321. In the embodiment shown in FIG. 11, the maximum length Lmax' of the third structure part 1321 in the fourth direction N and the minimum length Lmin' of the third structure part 1321 in the fourth direction N meet: Lmax'=Lmin'. It may be considered that the size of the third structure part 1321 does not change in the direction perpendicular to the extension direction of the third structure part 1321. In other words, a size change of the third structure part 1321 in the direction perpendicular to the extension direction of the third structure part 1321 is small, and the third structure part 1321 is a main channel of a signal of the second electrode 12. Therefore, in this solution, signal uniformity of the second electrode part 132 in an extension direction of the second electrode part 132 is good. In this solution, a size of the fourth structure part 1322 may be small, and a smaller size of the fourth structure part 1322 is more conducive to improving the signal uniformity of the second electrode part 132. Because the second electrode 12 is formed by electrically connecting the plurality of second electrode parts 132, and the signal uniformity of the second electrode part 132 in the extension direction of the second electrode part 132 is good, signal uniformity of the second electrode 12 in an extension direction of the second electrode 12 is also good. Therefore, in this solution, coordinate deviation values of the touch control substrate 240 at different positions may be small, and linearity of the stylus can be improved. This further improves user experience and improves professional performance of the electronic device having the touch display 200. For example, it is more beneficial to use the electronic device as a drawing board to draw various images or graphics.

To further improve the signal uniformity of the second electrode 12 in the extension direction of the second electrode 12, the maximum length Lmax' of the third structure part 1321 in the fourth direction N and the minimum length Lmin' of the third structure part 1321 in the fourth direction N meet: Lmax'≤3Lmin'. A smaller size change of the third structure part 1321 in the direction perpendicular to the extension direction of the third structure part 1321 is more conducive to improving the signal uniformity of the second electrode 12 in the extension direction of the second electrode 12. In an embodiment, the third structure part 1321 may be closer to a strip shape, or the third structure part 1321 may be rectangular.

Specific shapes of the third structure part 1321 and the fourth structure part 1322 are not limited. Specifically, an edge that is of the third structure part 1321 and that extends in the second direction Y may be a straight line, a serrated line, a wavy line, a line having a groove, or the like. The third structure part 1321 has two of the edges side by side in the fourth direction N. The two edges may be disposed in parallel, or may be disposed symmetrically, or may be disposed according to a requirement. The following lists several possible embodiments to describe a shape of the second electrode part 132 in embodiments of this application.

In addition, the second electrode part 132 may alternatively be of a symmetric structure, and a symmetry axis of the second electrode part 132 extends in the second direction Y. This solution helps improve the signal uniformity of the second electrode 12 in the extension direction, to help improve the signal uniformity of the touch control substrate 240, and help manufacture the touch control layer 1. Certainly, in another embodiment, the second electrode part 132 may alternatively be of an asymmetric structure. This is not limited in this application.

In this embodiment of this application, for determining of specific shapes of the second electrode part 132 and the fourth structure part 1322, refer to the embodiment related to the first electrode part 131. Details are not described herein again.

Figure 12A:
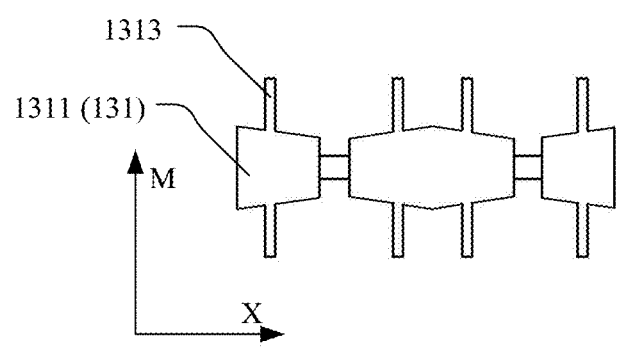
FIG. 12*a* is a diagram of a structure of a first electrode part according to an embodiment of this application.
Figure 12B:
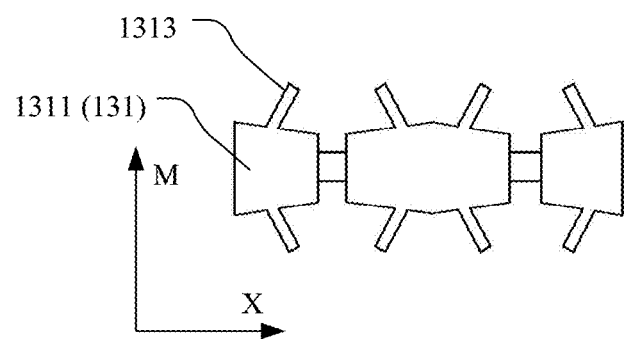
FIG. 12*b* is a diagram of another structure of a first electrode part according to an embodiment of this application.
Figure 12C:
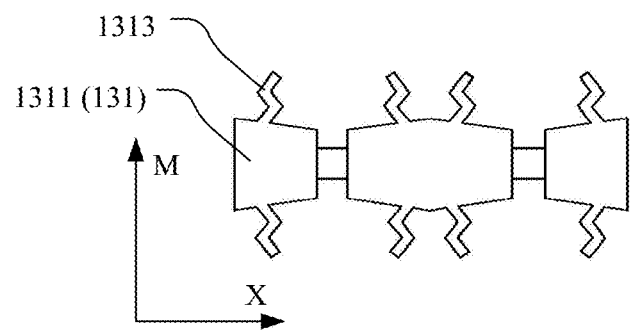
FIG. 12*c* is a diagram of another structure of a first electrode part according to an embodiment of this application.

The first electrode part 131 and the second electrode part 132 each may have a branch part. FIG. 12*a* to FIG. 12*c* are diagrams of several structures of the first electrode part 131 according to an embodiment of this application. As shown in FIG. 12*a* to FIG. 12*c*, the first electrode part 131 may include at least one first branch part 1313, and the first branch part 1313 is electrically connected to the first structure part 1311. In this way, in addition to extending in the first direction X, the first electrode part 131 may further extend to another area, so that the first electrode part 131 may be distributed in a large amount of space, to supplement a spatial signal uniformity of the first electrode part 131, and ensure good uniformity of a signal of the first electrode part 131 in the entire touch control unit 13. Specifically, the first branch part 1313 forms a specified included angle with the first direction X, to extend in a direction other than the extension direction of the first structure part 1311. For example, in the embodiment shown in FIG. 12*a*, the first branch part 1313 is perpendicular to the first direction X. In other words, the specified included angle between the first branch part 1313 and the first direction X is right-angle included angle. As shown in FIG. 12*b*, the specified included angle between the first branch part 1313 and the first direction X is an acute included angle. In the embodiments shown in FIG. 12*a* to FIG. 12*c*, only an example in which each side of the first electrode part 131 includes one first branch part 1313 is used. In actual application, two or more first branch parts 1313 may be disposed on each side of the first structure part 1311 according to a requirement. This is not limited in this application.

When the first branch part 1313 is specifically disposed, the first branch part 1313 and the first structure part 1311 may be of an integrated structure, to simplify a manufacturing process of the first branch part 1313, and improve reliability of a connection between the first branch part 1313 and the first structure part 1311. Certainly, in another embodiment, the first branch part 1313 may alternatively be electrically connected to the first structure part 1311 through a structure like a bridge.

Still refer to FIG. 12*a* to FIG. 12*c*. The first branch part 1313 may be a straight-type first branch part 1313 or a bent-type first branch part 1313. This is not limited in this application. When the first branch part 1313 is the bent-type first branch part 1313, it may be considered that an approximate extension direction of the first branch part 1313 is an extension direction of the first branch part 1313, and the extension direction forms a specified included angle with the first direction X, and is a direction other than the extension direction of the first structure part 1311.

In addition, refer to FIG. 12*a* to FIG. 12*c*. The first electrode part 131 is symmetrically disposed, and a symmetry axis may be parallel to the first direction X. In other words, the first branch parts 1313 are symmetrically disposed on two sides of the first structure part 1311. In addition, two first electrode parts 131 may alternatively be symmetrically disposed with respect to the second electrode 12, to improve the signal uniformity.

Figure 13A:
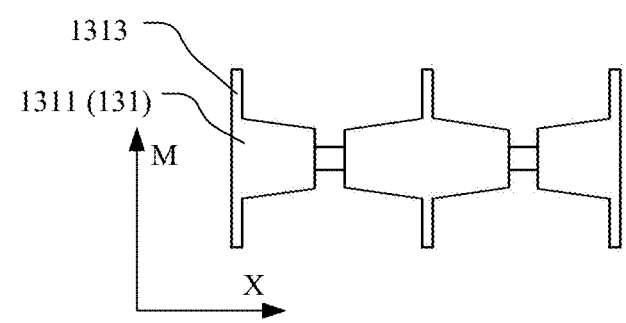
FIG. 13*a* is a diagram of another structure of a first electrode part according to an embodiment of this application.
Figure 13B:
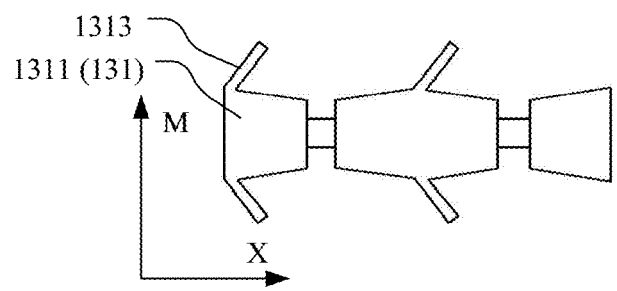
FIG. 13*b* is a diagram of another structure of a first electrode part according to an embodiment of this application.
Figure 13C:
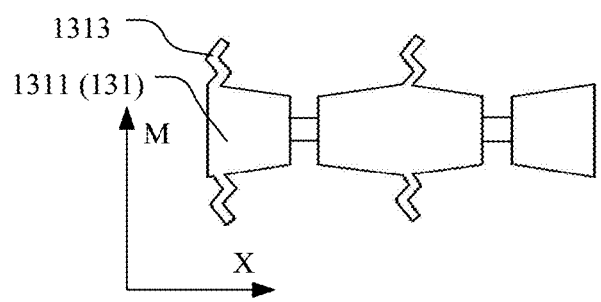
FIG. 13*c* is a diagram of another structure of a first electrode part according to an embodiment of this application.

FIG. 13*a* to FIG. 13*c* are diagrams of several other structures of the first electrode part 131 according to an embodiment of this application. As shown in FIG. 13*a* to FIG. 13*c*, when the first branch part 1313 is specifically disposed, the first branch part 1313 may be located at an edge of the touch control unit 13, to reserve accommodation space for another structure.

Figure 14:
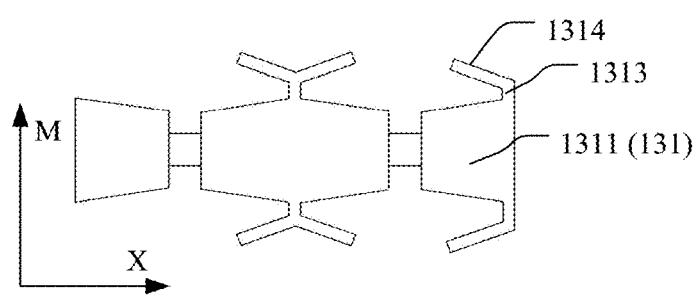
FIG. 14 is a diagram of another structure of a first electrode part according to an embodiment of this application.

FIG. 14 is a diagram of another structure of the first electrode part 131 according to an embodiment of this application. As shown in FIG. 14, the first electrode part 131 may further include at least one second branch part 1314. The second branch part 1314 is electrically connected to the first branch part 1313, and the second branch part 1314 forms a specific angle with the first branch part 1313, and may be specifically vertical to or may not be vertical to the first branch part 1313, to extend to a wider area. In this solution, distribution space of the first electrode part 131 may be further increased, to further supplement the spatial signal uniformity of the first electrode part 131, so that uniformity of a signal of the first electrode part 131 in the entire touch control unit 13 is good. In the embodiment shown in FIG. 14, only an example in which one second branch part 1314 is disposed on each side of the first structure part 1311 is used. In actual application, two or more second branch parts 1314 may be disposed on each side of the first structure part 1311 according to a requirement. This is not limited in this application. In addition, each first branch part 1313 may be connected to one second branch part 1314, or each first branch part 1313 may be connected to two or more second branch parts 1314. Alternatively, when the first electrode part 131 includes at least two first branch parts 1313, only a part of the first branch parts 1313 may be connected to the second branch part 1314, and the other part is not connected to the second branch part 1314. In addition, in the first branch parts 1313 connected to the second branch parts 1314, quantities of second branch parts 1314 connected to different first branch parts 1313 may be the same or different. This is not limited in this application.

In a specific embodiment, an extension direction of the second branch part 1314 and an extension direction of the first structure part 1311 may be at a specific angle. In other words, the extension direction of the second branch part 1314 and the first direction X are at a specific angle. Specifically, the angle may be less than 90°. In addition, the second branch part 1314 is different from a bent part of the first branch part 1313 to a specific extent. Specifically, the second branch part 1314 needs to extend out of the first branch part 1313 for a specific length. Specifically, a length of the second branch part 1314 needs to be greater than a width of the first branch part 1313. Herein, the length is a size in an extension direction, and the width is a size in a direction perpendicular to the extension direction.

The second branch parts 1314 are symmetrically disposed on two sides of the first structure part 1311, and a symmetry axis may be parallel to the first direction X. In addition, the first branch parts 1313 may further be symmetrically disposed with respect to the second electrode 12, to improve the signal uniformity.

In other words, the entire first electrode part 131 may be of a symmetric structure, and a symmetry axis of the first electrode part 131 extends in the first direction X. In addition, the two first electrode parts 131 of the touch control unit 13 may further be symmetrically disposed with respect to the second electrode 12, to improve the signal uniformity.

When the second branch part 1314 is specifically disposed, the first branch part 1313, the second branch part 1314, the first structure part 1311, and the second structure part 1312 may be of an integrated structure, to simplify a manufacturing process of the first electrode part 131. In addition, reliability of connections between the first branch part 1313, the second branch part 1314, the first structure part 1311, and the second structure part 1312 may be further improved. Certainly, in another embodiment, the first branch part 1313, the second branch part 1314, and the first structure part 1311 may alternatively be electrically connected through a structure like a bridge.

Similarly, the second branch part 1314 may be a straight-type second branch part 1314 or a bent-type second branch part 1314. This is not limited in this application. When the second branch part 1314 is the bent-type second branch part 1314, it may be considered that an approximate extension direction of the second branch part 1314 is an extension direction of the second branch part 1314, and the extension direction and the extension direction of the first branch part 1313 form a specified included angle.

In addition, when the second branch part 1314 is specifically disposed, the second branch part 1314 may also be located at an edge of the touch control unit 13, to reserve accommodation space for another structure. For example, the second electrode part 132 may also have a branch part, so that the branch part of the first electrode part 131 may reserve disposing space for the branch part of the second electrode part 132.

Figure 15:
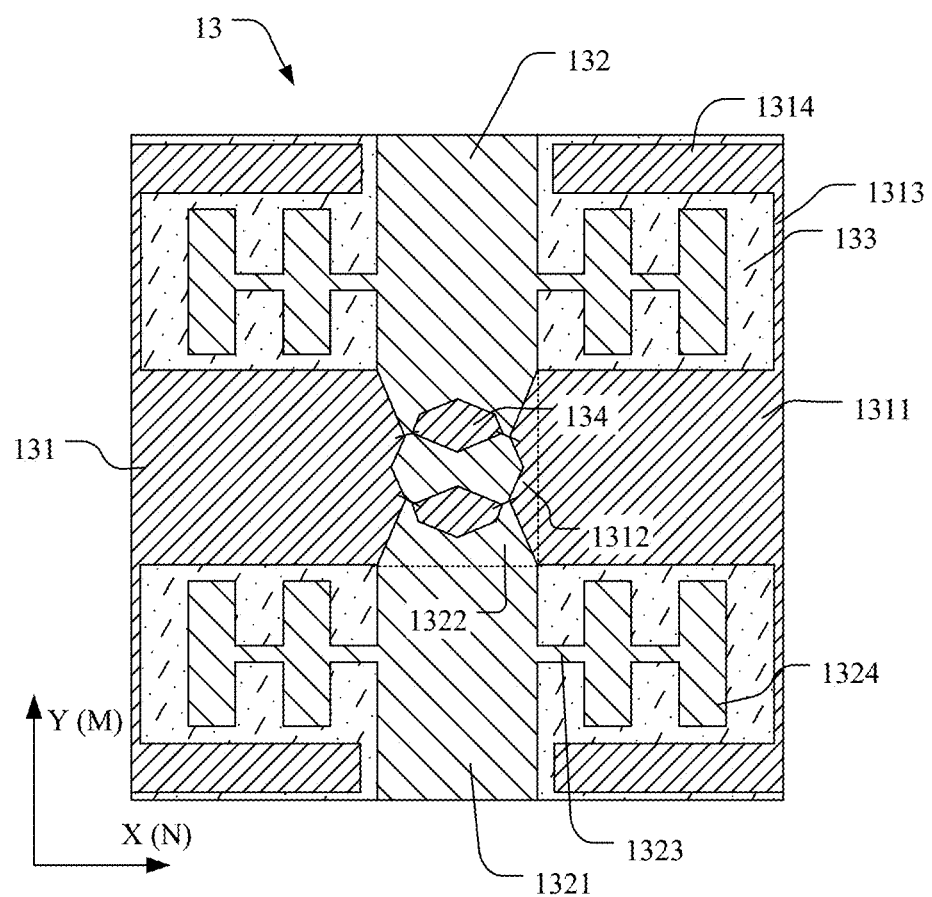
FIG. 15 is a diagram of another structure of a touch control unit according to an embodiment of this application.

FIG. 15 is a diagram of another structure of the touch control unit 13 according to an embodiment of this application. As shown in FIG. 15, the second electrode part 132 includes at least one third branch part 1323, and the third branch part 1323 is electrically connected to the third structure part 1321. In this way, in addition to extending in the second direction Y, the second electrode part 132 may further extend to another area, so that the second electrode part 132 extends to a large amount of space, to supplement a spatial signal uniformity of the second electrode part 132, and ensure good uniformity of a signal of the second electrode part 132 in the entire touch control unit 13. Specifically, an extension direction of the third branch part 1323 forms a specified included angle with the second direction Y, and is a direction other than the extension direction of the third structure part 1321. For example, in the embodiment shown in FIG. 15, the extension direction of the third branch part 1323 is perpendicular to the second direction Y. In other words, the specified included angle between the extension direction of the third branch part 1323 and the second direction Y is a right-angle included angle. In another embodiment, the specified included angle between the extension direction of the third branch part 1323 and the second direction Y may alternatively be an acute included angle. This is not limited in this application. In the embodiment shown in FIG. 15, only an example in which each side of the second electrode part 132 includes one third branch part 1323 is used. In actual application, two or more third branch parts 1323 may be disposed on each side of the third structure part 1321 according to a requirement. This is not limited in this application.

When the third branch part 1323 is specifically disposed, the third branch part 1323 and the third structure part 1321 may be of an integrated structure, to simplify a manufacturing process of the third branch part 1323, and improve reliability of a connection between the third branch part 1323 and the third structure part 1321. Certainly, in another embodiment, the third branch part 1323 and the third structure part 1321 may alternatively be electrically connected through a structure like a bridge.

The third branch part 1323 may be a straight-type third branch part 1323 or a bent-type third branch part 1323. This is not limited in this application. When the third branch part 1323 is the bent-type third branch part 1323, it may be considered that an approximate extension direction of the second branch part 1314 is an extension direction of the second branch part 1314, and the extension direction forms a specified included angle with the second direction Y, and is a direction other than the extension direction of the third structure part 1321.

In a specific embodiment, an extension direction of the fourth branch part 1324 and an extension direction of the third structure part 1321 may be at a specific angle. In other words, the extension direction of the fourth branch part 1324 and the second direction Y are at a specific angle. Specifically, the angle may be less than 90°. In addition, a bent part of the fourth branch part 1324 is different from a bent part of the third branch part 1323 to a specific extent. Specifically, the fourth branch part 1324 needs to extend out of the third branch part 1323 for a specific length. To be specific, a length of the fourth branch part 1324 needs to be greater than the width of a third branch part 1323. Herein, the length is a size in an extension direction, and the width is a size in a direction perpendicular to the extension direction.

In addition, refer to FIG. 15. The second electrode part 132 may be symmetrically disposed. In other words, the third branch part 1323 may be symmetrically disposed on two sides of the third structure part 1321, and a symmetry axis may be parallel to the second direction Y. In addition, two second electrode parts 132 may alternatively be symmetrically disposed with respect to the first electrode 11, to improve the signal uniformity.

In the embodiment shown in FIG. 15, both the first branch part 1313 and the second branch part 1314 of the first electrode part 131 are located at an edge of the touch control unit 13, so that the third branch part 1323 may be disposed in accommodation space reserved by the first branch part 1313 and the second branch part 1314. In this way, the first electrode 11 and the second electrode 12 are distributed in entire space of the touch control unit 13, to improve a spatial signal uniformity of the touch control unit 13.

Refer to FIG. 15. The second electrode part 132 may further include at least one fourth branch part 1324, and the fourth branch part 1324 is electrically connected to the third branch part 1323. An extension direction of the fourth branch part 1324 forms a specific angle with the extension direction of the third branch part 1323, and may be specifically vertical to or may not be vertical to the extension direction of the third branch part 1323, to cover a wider area. In this way, space for extension of the second electrode part 132 may be further increased, to further supplement the spatial signal uniformity of the second electrode part 132, so that uniformity of a signal of the second electrode part 132 in the entire touch control unit 13 is good. In the embodiment shown in FIG. 15, only an example in which two fourth branch parts 1324 are disposed on each side of the third structure part 1321 is used. In actual application, one or at least three fourth branch parts 1324 may be disposed on each side of the third structure part 1321 according to a requirement. This is not limited in this application. In addition, each third branch part 1323 may be connected to one fourth branch part 1324, or each third branch part 1323 may be connected to two or more fourth branch parts 1324. Alternatively, when the second electrode part 132 includes at least two third branch parts 1323, only a part of the third branch parts 1323 may be connected to the fourth branch part 1324, and the other part is not connected to the fourth branch part 1324. In addition, in the third branch parts 1323 connected to the fourth branch parts 1324, quantities of fourth branch parts 1324 connected to different third branch parts 1323 may be the same or may be different. This is not limited in this application.

The fourth branch parts 1324 may be symmetrically disposed on two sides of the third structure part 1321, and a symmetry axis may be parallel to the second direction Y. In addition, two second electrode parts 132 may alternatively be symmetrically disposed with respect to the first electrode 11, to improve the signal uniformity.

The second electrode part 132 may be of a symmetric structure, and a symmetry axis of the second electrode part 132 extends in the second direction Y. In addition, two second electrode parts 132 may alternatively be symmetrically disposed with respect to the first electrode 11, to improve the signal uniformity.

When the fourth branch part 1324 is specifically disposed, the third branch part 1323, the fourth branch part 1324, and the third structure part 1321 may be of an integrated structure, to simplify a manufacturing process of the second electrode part 132, and improve reliability of connections between the third branch part 1323, the fourth branch part 1324, and the third structure part 1321. Certainly, in another embodiment, the third branch part 1323, the fourth branch part 1324, and the third structure part 1321 may alternatively be electrically connected through a structure like a bridge.

Similarly, the fourth branch part 1324 may be a straight-type fourth branch part 1324 or a bent-type fourth branch part 1324. This is not limited in this application. When the fourth branch part 1324 is the bent-type fourth branch part 1324, it may be considered that an approximate extension direction of the second branch part 1314 is an extension direction of the second branch part 1314, and the extension direction and the extension direction of the third branch part 1323 form a specified included angle.

Refer to FIG. 15. In a specific embodiment, the two second electrode parts 132 in the touch control unit 13 may be of an integrated structure, to implement an electrical connection between the two second electrode parts 132. This helps simplify the manufacturing process of the second electrode parts 132.

Two first electrode parts 131 in one touch control unit 13 may be connected through a bridge. The first electrode part 131 and the second electrode part 132 are disposed at a same layer, and the first electrode part 131 and the second electrode part 132 need to be insulated from each other and cannot be conducted. Therefore, in the touch control unit 13, the two first electrode parts 131 are connected through a bridge and/or the two second electrode parts 132 are connected through a bridge. Specifically, the bridge may be a top bridge, or may be a bottom bridge. This is not limited in this application.

A material of the bridge in embodiments of this application may be single-layer metal, for example, metal molybdenum (Mo), metal titanium (Ti), or metal aluminum (Al), or may be multi-layer metal, for example, a titanium (Ti) layer, an aluminum (Al) layer, and a titanium (Ti) layer that are sequentially stacked, or a molybdenum (Mo) layer, an aluminum (Al) layer, and a molybdenum (Mo) layer that are sequentially stacked, or may be a conductive medium, for example, indium tin oxide (ITO) or a silver (Ag) nanowire. This is not limited in this application.

In addition, still refer to FIG. 15. In a specific embodiment, the touch control unit 13 may further include an additional part 134, and the two first electrode parts 131 are electrically connected to the additional part 134, to implement an electrical connection between the two first electrode parts 131. In embodiments, a length of the bridge may be small, to help improve reliability of the bridge. In this way, the bridge is not easily damaged, to improve service lives of the touch control substrate 240 and the touch display 200.

The inventor of this application compares and analyzes embodiments of this application with a comparative example. Specifically, the touch control unit 13 in embodiments of this application is shown in FIG. 15. The touch control unit 13 includes two first electrode parts 131 and two second electrode parts 132. The touch control unit 13 further includes an additional part 134, and the two first electrode parts 131 are electrically connected to the additional part 134 through bridges, to implement the electrical connection between the two first electrode parts 131. The two second electrode parts 132 are of an integrated structure. The touch control unit 13 is of a symmetric structure, and has symmetry axes in both a first direction X and a second direction Y. Therefore, signal uniformity is also good. In embodiments, if the first direction X is perpendicular to the second direction Y, a third direction M is the same as the second direction Y, and a fourth direction N is the same as the first direction X. A first structure part 1311 of the first electrode part 131 is rectangular. In other words, a maximum length Lmax of the first structure part 1311 in the third direction M and a minimum length Lmin of the first structure part 1311 in the third direction M meet: Lmax=Lmin. A third structure part 1321 of the second electrode part 132 is also rectangular. In other words, a maximum length Lmax' of the third structure part 1321 in the fourth direction N and a minimum length Lmin' of the third structure part 1321 in the fourth direction N meet: Lmax'=Lmin'. The first electrode part 131 has one first branch part 1313 on each of two sides in the first direction X, and the first branch part 1313 is perpendicular to the first direction X and is located at an edge of the touch control unit 13. Each first branch part 1313 is further connected to a second branch part 1314, and the second branch part 1314 is perpendicular to the first branch part 1313. In other words, the second branch part 1314 is parallel to the second direction Y. The second branch part 1314 is also located at the edge of the touch control unit 13. As shown in FIG. 15, the first branch part 1313 and the second branch reserve enough space for the second electrode part 132, and the first electrode part 131 is provided in each area of entire space of the touch control unit 13. Therefore, a spatial signal uniformity is good. In addition, the second electrode part 132 has one third branch part 1323 on each of two sides in the second direction Y. The third branch part 1323 is perpendicular to the second direction Y, each third branch part 1323 is connected to two fourth branch parts 1324, and the two fourth branch parts 1324 are disposed in parallel and are perpendicular to the third branch part 1323.

Figure 16:
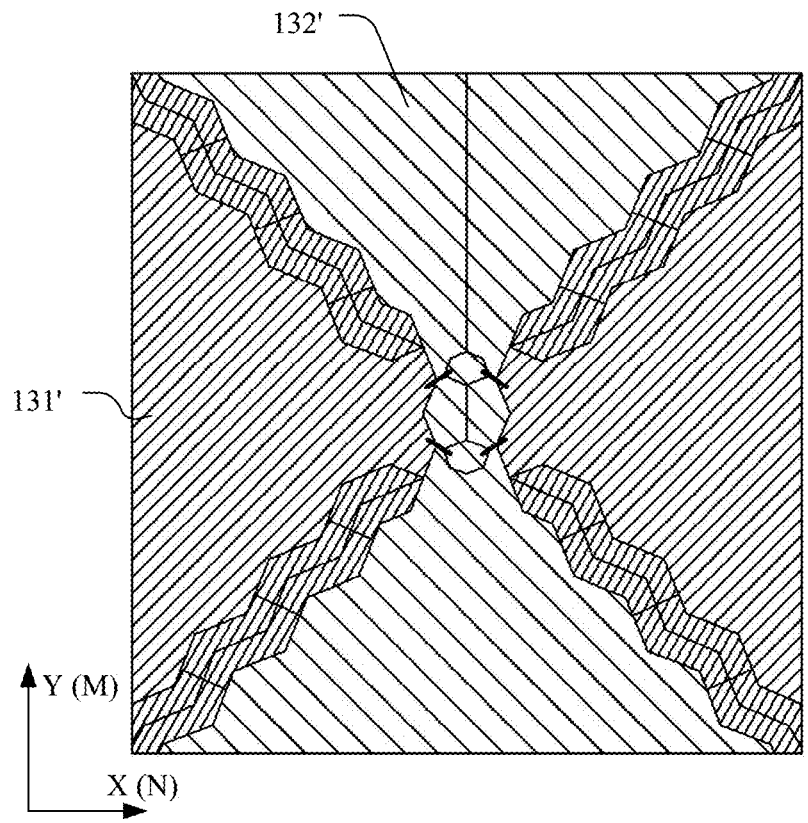
FIG. 16 is a diagram of a structure of a touch control unit in the conventional technology.

FIG. 16 is a diagram of a structure of a touch control unit in the conventional technology. The touch control unit shown in FIG. 16 is used as a comparative example. As shown in FIG. 16, the touch control unit in the comparative example also includes two first electrode parts 131' and two second electrode parts 132'. The first electrode part 131' is trigonal. That is, a change rate of a length of the first electrode part 131' in a third direction M is large. The second electrode part 132' is also trigonal. That is, a change rate of a length of the second electrode part 132' in the third direction M is large.

Figure 17:
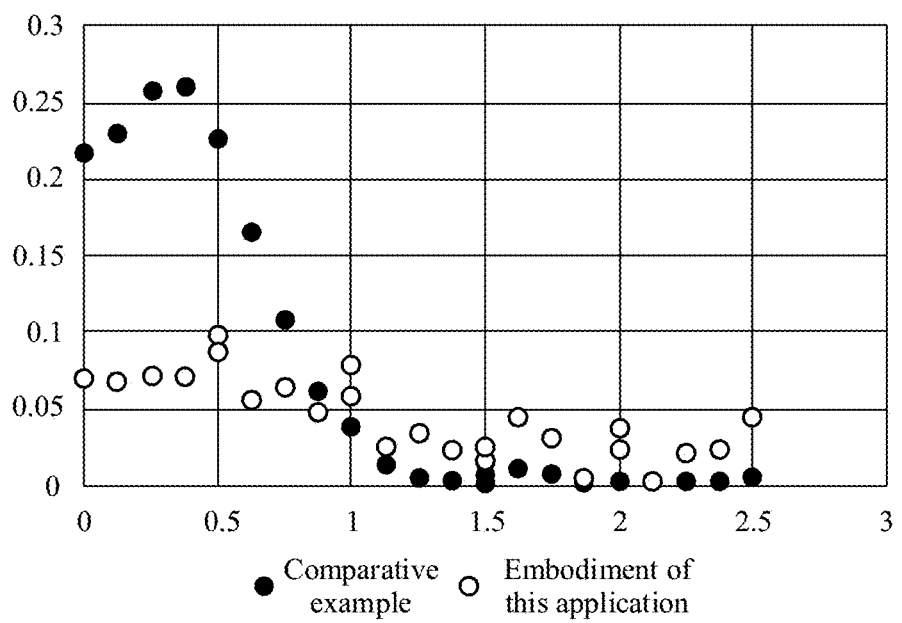
FIG. 17 is a diagram of comparison between signal difference values of a touch control unit according to an embodiment of this application and a touch control unit in a comparative example.
Figure 18:
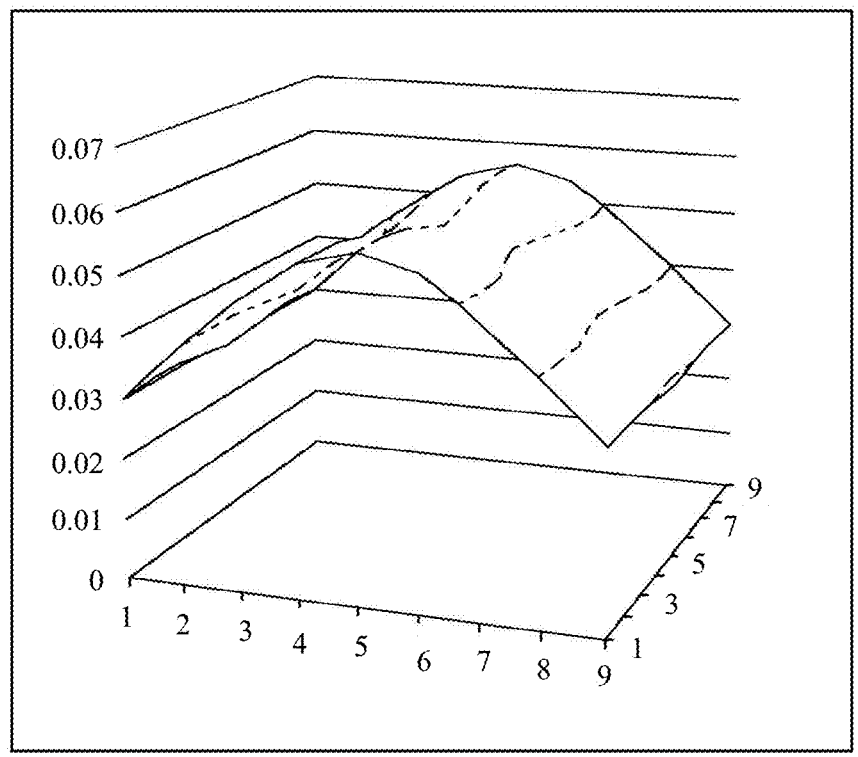
FIG. 18 is a simulation diagram of signal distribution in a touch control unit according to an embodiment of this application.
Figure 19:
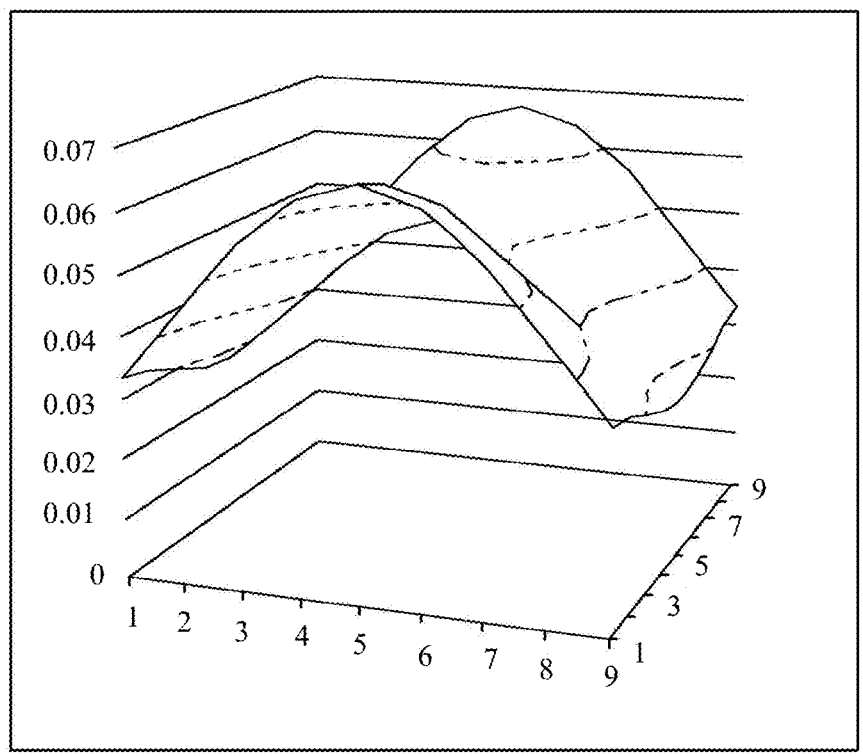
FIG. 19 is a simulation diagram of signal distribution in a touch control unit in a comparative example.

FIG. 17 is a diagram of comparison between signal difference values of the touch control unit according to an embodiment of this application and the touch control unit in the comparative example. A horizontal coordinate represents a distance from a center of the touch control unit, and a vertical coordinate represents a signal difference value. It can be learned from FIG. 17 that the signal difference value of the touch control unit in embodiments of this application does not exceed 0.1 (10%), that is, signal uniformity is greater than 90%. However, the signal difference value of the touch control unit in the comparative example is up to 0.26 (26%), and signal uniformity is approximately 74%. FIG. 18 is a simulation diagram of signal distribution in the touch control unit according to an embodiment of this application. FIG. 19 is a simulation diagram of signal distribution in the touch control unit in the comparative example. It can be learned that signal distribution in the comparative example is significantly in a saddle shape. However, in embodiments of this application, signal distribution is uniform, and a saddle shape phenomenon is greatly reduced. It can be learned that signal uniformity of the touch control unit in embodiments of this application is greatly improved compared with that in the conventional technology.

Figure 20:
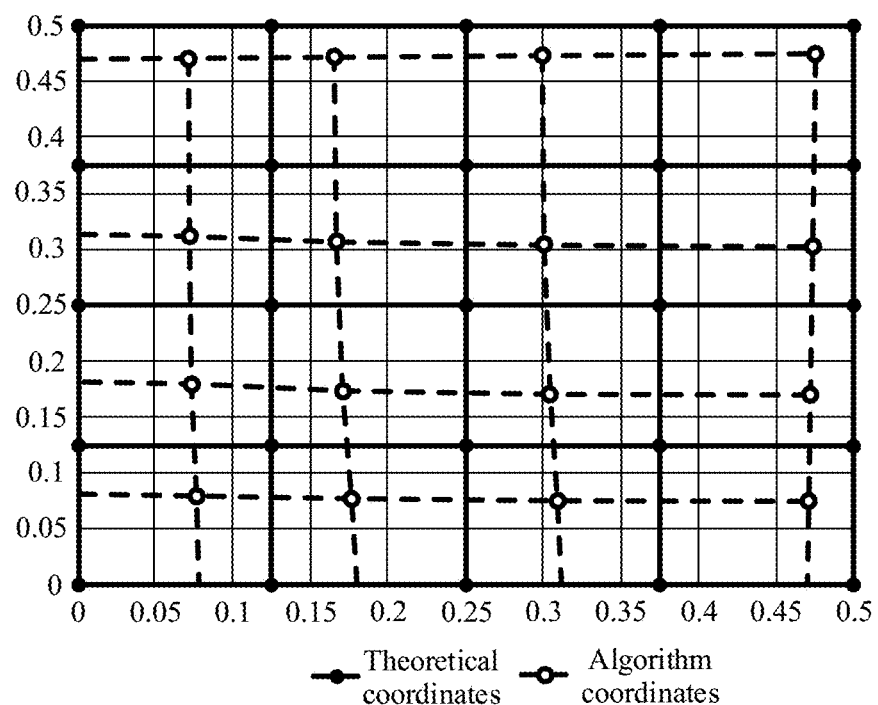
FIG. 20 is a diagram of a coordinate deviation of a touch control unit in a comparative example.
Figure 21:
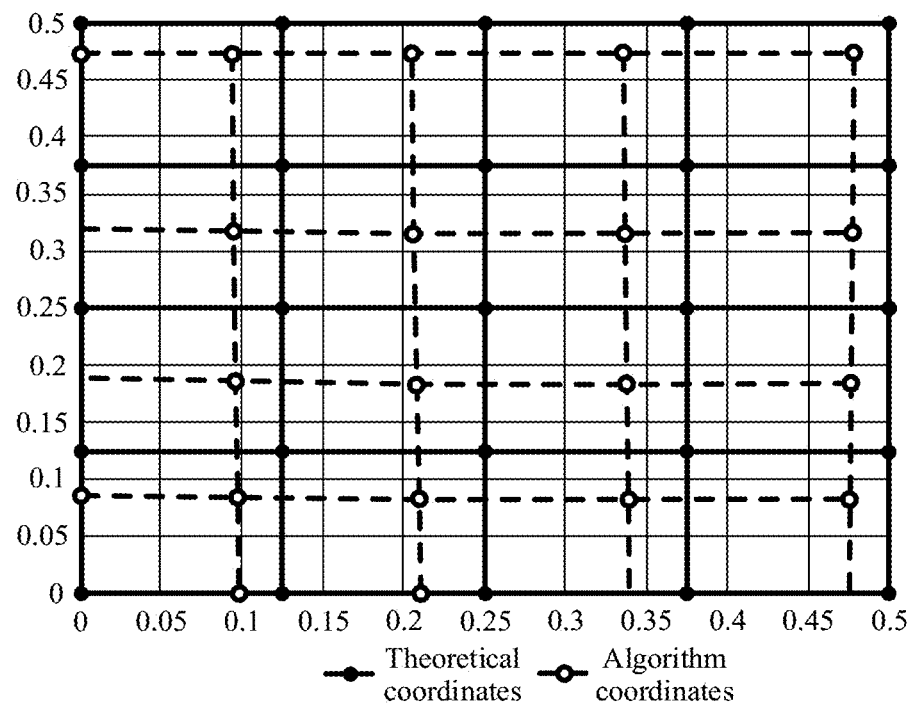
FIG. 21 is a diagram of a coordinate deviation of a touch control unit according to an embodiment of this application.

FIG. 20 is a diagram of a coordinate deviation of the touch control unit in the comparative example. A horizontal coordinate represents position coordinates of the touch control unit in an x direction, and a vertical coordinate represents position coordinates of the touch control unit in a y direction. It can be learned from FIG. 20 that, algorithm coordinates triggered on a touchpad of the touch control unit in the comparative example are far away from theoretical coordinates. In addition, the horizontal coordinates and the vertical coordinates are not straight lines in a vertical dimension, and have distortion with a large deviation. If a deviation exists in both the two directions, distortion in a two-dimensional plane is caused. In the figure, it can be seen that a line between algorithm coordinates is greatly different from a line between theoretical coordinates, and a line between algorithm coordinates is relatively curved. FIG. 21 is a diagram of a coordinate deviation of the touch control unit according to an embodiment of this application. A horizontal coordinate represents position coordinates of the touch control unit in an x direction, and a vertical coordinate represents position coordinates of the touch control unit in a y direction. It can be learned from FIG. 21 that, in embodiments of this application, algorithm coordinates triggered on a touchpad of the touch control unit are relatively close to theoretical coordinates, and a line of the algorithm coordinates is relatively parallel to a line of the theoretical coordinates. Grid lines in FIG. 20 and FIG. 21 may represent algorithm tracks (actual tracks) and theoretical tracks of drawing lines by a stylus in two dimensions. If there is a fixed deviation or overlap between the algorithm track and the theoretical track, it is considered that the stylus has a better linearity in the touch control unit. It can be learned that, in embodiments of this application, a problem of linearity of the stylus can be better improved.

Figure 22:
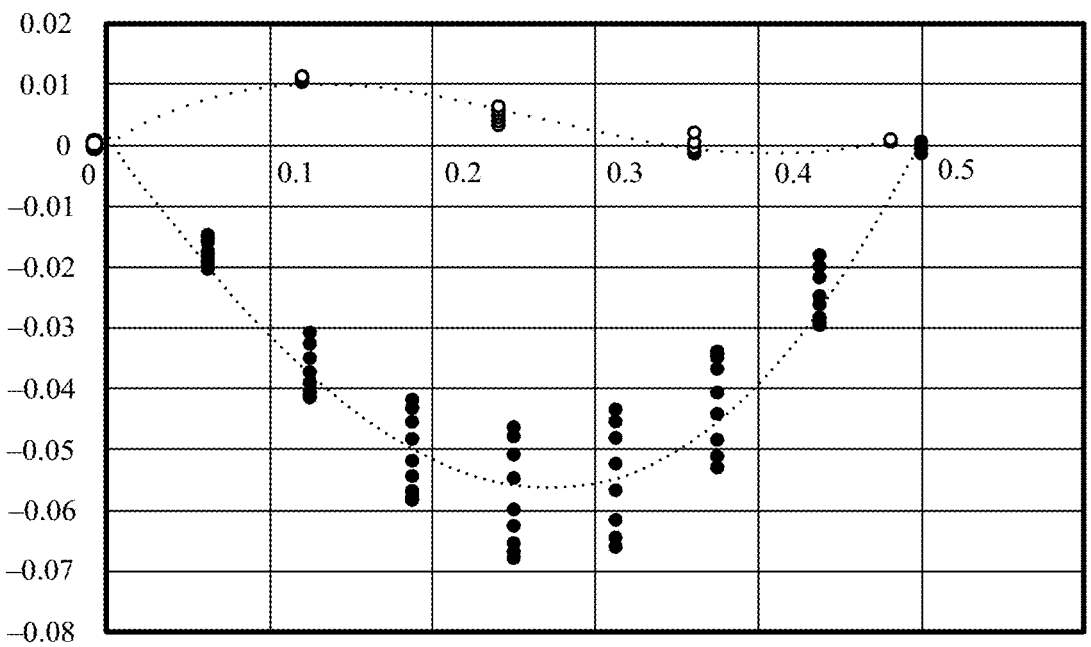
FIG. 22 is a diagram of coordinate deviations of a touch control unit according to an embodiment of this application and a touch control unit in a comparative example.

FIG. 22 is a diagram of coordinate deviations of the touch control unit according to an embodiment of this application and the touch control unit in the comparative example. FIG. 22 shows algorithm coordinate deviations of the touch control unit in the comparative example and the touch control unit according to an embodiment in one direction. A higher coordinate coincidence degree (a larger aggregation) indicates a smaller coordinate deviation, and a lower coordinate coincidence degree (a smaller dispersion) indicates a larger coordinate deviation. In the figure, solid marks are algorithm coordinates in the comparative example, and hollow marks are algorithm coordinates in embodiments of this application. It can be learned from the figure that the algorithm coordinates in embodiments of this application are very centralized relative to the comparative example, and a coordinate deviation is very small.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A touch control assembly, comprising:
a substrate; and
a touch control layer disposed on a surface of the substrate comprising a plurality of touch control units that are arranged in an array,
wherein each touch control unit of the plurality of touch control units comprises:
two first electrode parts that are electrically connected to each other and two second electrode parts that are electrically connected to each other, each of the first electrode parts extending in a first direction and each of the second electrode parts extending in a second direction, the first direction intersecting with the second direction; and
each of the first electrode parts comprises a first structure part and a second structure part connected to the first structure part, wherein:
the second structure part has a length a in the first direction,
the first structure part has a maximum length Lmax in a third direction and a minimum length Lmin in the third direction, the lengths a, Lmax, and Lmin meeting: a≤Lmax≤5Lmin, and
the third direction is perpendicular to the first direction.

2. The touch control assembly according to claim 1, wherein at least one of the first electrode parts further comprises at least one first branch part electrically connected to its first structure part.

3. The touch control assembly according to claim 2, wherein the first branch part is located in an edge area of its respective touch control unit.

4. The touch control assembly according to claim 2, further comprising at least one second branch part electrically connected to one of the at least one first branch part.

5. The touch control assembly according to claim 4, wherein the at least one of the first structure part, at least one of the second structure part, the at least one first branch part, and the at least one second branch part comprise an integrated structure.

6. The touch control assembly according to claim 4, wherein the at least one second branch part is located in an edge area of its respective touch control unit.

7. The touch control assembly according to claim 1, wherein at least one of the first electrode parts is of a symmetric structure, and a symmetry axis of the at least one of the first electrode parts extends in the first direction.

8. The touch control assembly according to claim 1, wherein the two first electrode parts in the touch control unit are connected through a bridge.

9. The touch control assembly according to claim 1, wherein at least one of the plurality of touch control units further comprises an electrically conductive additional part electrically connected to each of the two first electrode parts through bridges.

10. The touch control assembly according to claim 1, wherein an edge of at least one of the first structure parts that extends in the first direction is a straight line, a serrated line, a wavy line, or a line having a groove.

11. The touch control assembly according to claim 1, wherein the maximum length Lmax and the minimum length Lmin meet: Lmax≤3Lmin.

12. The touch control assembly according to claim 1, wherein each of the second electrode parts comprises a third structure part and a fourth structure part connected to the third structure part, wherein:
the fourth structure part has a length a' in the second direction,
the third structure part has a maximum length Lmax' in a fourth direction and a minimum length Lmin' in the fourth direction, the lengths a', Lmax', and Lmin' meeting: a'≤Lmax'≤5Lmin', and
the fourth direction is perpendicular to the second direction.

13. The touch control assembly according to claim 12, wherein at least one of the second electrode parts further comprises at least one third branch part electrically connected to its third structure part.

14. The touch control assembly according to claim 12, wherein at least one of the second electrode parts is of a symmetric structure, and a symmetry axis of the at least one of the second electrode parts extends in the second direction.

15. The touch control assembly according to claim 12, wherein an edge of at least one of the third structure parts that extends in the second direction is a straight line, a serrated line, a wavy line, or a line having a groove.

16. The touch control assembly according to claim 12, wherein the maximum length Lmax' and the minimum length Lmin' meet: Lmax'≤3Lmin'.

17. A touch display, comprising:
a light emitting layer;
an encapsulation layer; and
a touch control comprising:
a substrate; and
a touch control layer disposed on a surface of the substrate comprising a plurality of touch control units that are arranged in an array,
wherein each touch control unit of the plurality of touch control units comprises:

two first electrode parts that are electrically connected to each other and two second electrode parts that are electrically connected to each other, each of the first electrode parts extending in a first direction and each of the second electrode parts extending in a second direction, the first direction intersecting with the second direction; and each of the first electrode parts comprises a first structure part and a second structure part connected to the first structure part, wherein:

the second structure part has a length a in the first direction, the first structure part has a maximum length Lmax in a third direction and a minimum length Lmin in the third direction, the lengths a, Lmax, and Lmin meeting: a≤Lmax≤5Lmin, and the third direction is perpendicular to the first direction, and wherein the encapsulation layer is disposed upon the light emitting layer, and the touch control is disposed upon the encapsulation layer.

18. The touch display according to claim 17, wherein at least one of the first electrode parts further comprises at least one first branch part electrically connected to its first structure part.

19. The touch display according to claim 18, further comprising at least one second branch part electrically connected to one of the at least one first branch part.

20. An electronic device, comprising:
a circuit board; and
a touch display, comprising:
a light emitting layer;
an encapsulation layer; and
a touch control comprising:
a substrate; and
a touch control layer disposed on a surface of the substrate comprising a plurality of touch control units that are arranged in an array,
wherein each touch control unit of the plurality of touch control units comprises:
two first electrode parts that are electrically connected to each other and two second electrode parts that are electrically connected to each other, each of the first electrode parts extending in a first direction and each of the second electrode parts extending in a second direction, the first direction intersecting with the second direction; and
each of the first electrode parts comprises a first structure part and a second structure part connected to the first structure part, wherein:
the second structure part has a length a in the first direction,
the first structure part has a maximum length Lmax in a third direction and a minimum length Lmin in the third direction, the lengths a, Lmax, and Lmin meeting: a≤Lmax≤5Lmin, and
the third direction is perpendicular to the first direction, and
wherein the encapsulation layer is disposed upon the light emitting layer, and the touch control is disposed upon the encapsulation layer; and
wherein the circuit board is electrically connected to the touch display.

* * * * *